(12) United States Patent
Kitagawa et al.

(10) Patent No.: US 9,640,752 B2
(45) Date of Patent: *May 2, 2017

(54) MAGNETORESISTIVE ELEMENT

(71) Applicant: KABUSHIKI KAISHA TOSHIBA, Minato-ku, Tokyo (JP)

(72) Inventors: Eiji Kitagawa, Yokohama (JP); Tadashi Kai, Tokyo (JP); Hiroaki Yoda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/860,406

(22) Filed: Sep. 21, 2015

(65) Prior Publication Data

US 2016/0013400 A1 Jan. 14, 2016

Related U.S. Application Data

(63) Continuation of application No. 14/160,419, filed on Jan. 21, 2014, now Pat. No. 9,178,133, which is a
(Continued)

(30) Foreign Application Priority Data

Jul. 22, 2011 (JP) .................................. 2011-160806
May 7, 2012 (JP) .................................. 2012-105812

(51) Int. Cl.
*H01F 10/32* (2006.01)
*H01L 43/08* (2006.01)
(Continued)

(52) U.S. Cl.
CPC ............ *H01L 43/08* (2013.01); *G01R 33/091* (2013.01); *G11C 11/161* (2013.01); *H01F 10/30* (2013.01);
(Continued)

(58) Field of Classification Search
None
See application file for complete search history.

(56) References Cited

U.S. PATENT DOCUMENTS 6,278,592 B1 8/2001 Xue et al.
8,299,552 B2 10/2012 Nagase et al.
(Continued)

FOREIGN PATENT DOCUMENTS

JP H02-194159 7/1990
JP 2000-106462 A 4/2000
(Continued)

OTHER PUBLICATIONS

U.S. Appl. No. 12/233,100, filed Sep. 18, 2008, Nagase et al.
(Continued)

*Primary Examiner* — Kevin Bernatz
(74) *Attorney, Agent, or Firm* — Knobbe, Martens, Olson & Bear, LLP

(57) ABSTRACT

According to one embodiment, a magnetoresistive element includes a recording layer having magnetic anisotropy perpendicular to a film surface and having a variable magnetization direction, a reference layer having magnetic anisotropy perpendicular to a film surface and having an invariable magnetization direction, an intermediate layer provided between the recording layer and the reference layer, and a underlayer containing AlTiN and provided on an opposite side of a surface of the recording layer on which the intermediate layer is provided.

10 Claims, 16 Drawing Sheets

Related U.S. Application Data continuation of application No. PCT/JP2012/063574, filed on May 21, 2012.

(51) Int. Cl.
- *G01R 33/09* (2006.01)
- *G11C 11/16* (2006.01)
- *H01L 43/10* (2006.01)
- *H01F 10/30* (2006.01)

(52) U.S. Cl.
CPC ......... *H01F 10/3286* (2013.01); *H01L 43/10* (2013.01); *G01R 33/093* (2013.01); *G01R 33/098* (2013.01)

(56) References Cited

U.S. PATENT DOCUMENTS

| | | |
|---|---|---|
| 8,374,025 B1 | 2/2013 | Ranjan et al. |
| 8,609,262 B2 | 12/2013 | Horng et al. |
| 8,680,632 B2 | 3/2014 | Daibou et al. |
| 8,750,029 B2 | 6/2014 | Kitagawa et al. |
| 8,895,162 B2 | 11/2014 | Nishiyama et al. |
| 8,982,616 B1 | 3/2015 | Ranjan et al. |
| 9,508,926 B2 * | 11/2016 | Kitagawa ............... H01L 43/08 |
| 2005/0019610 A1 | 1/2005 | Fujikata et al. |
| 2005/0254286 A1 | 11/2005 | Valet |
| 2007/0047159 A1 | 3/2007 | Zhao et al. |
| 2008/0253174 A1 | 10/2008 | Yoshikawa et al. |
| 2008/0266725 A1 | 10/2008 | Shatz et al. |
| 2008/0273380 A1 | 11/2008 | Diao et al. |
| 2009/0079018 A1 | 3/2009 | Nagase et al. |
| 2009/0243008 A1 | 10/2009 | Kitagawa et al. |
| 2009/0244790 A1 | 10/2009 | Ibusuki et al. |
| 2009/0251951 A1 | 10/2009 | Yoshikawa et al. |
| 2009/0256220 A1 | 10/2009 | Horng et al. |
| 2010/0117169 A1 | 5/2010 | Anderson et al. |
| 2010/0244163 A1 | 9/2010 | Daibou et al. |
| 2011/0014500 A1 | 1/2011 | Horng et al. |
| 2011/0049659 A1 | 3/2011 | Suzuki et al. |
| 2011/0089940 A1 | 4/2011 | Carey et al. |
| 2011/0227179 A1 | 9/2011 | Kitagawa et al. |
| 2012/0070695 A1 | 3/2012 | Kitagawa et al. |
| 2012/0088125 A1 * | 4/2012 | Nishiyama ............. B82Y 25/00 428/828 |
| 2012/0313191 A1 | 12/2012 | Whig et al. |
| 2013/0307099 A1 | 11/2013 | Kitagawa et al. |
| 2014/0035074 A1 | 2/2014 | Jan et al. |
| 2014/0042573 A1 | 2/2014 | Yamane et al. |
| 2014/0131649 A1 | 5/2014 | Daibou et al. |
| 2014/0131824 A1 | 5/2014 | Kitagawa et al. |

FOREIGN PATENT DOCUMENTS

| | | |
|---|---|---|
| JP | 2008-252018 | 10/2008 |
| JP | 2009-081314 B2 | 4/2009 |
| JP | 2009-239121 A1 | 10/2009 |
| JP | 2009-253303 | 10/2009 |
| JP | 2010-232499 | 10/2010 |
| JP | 2010-238769 | 10/2010 |
| JP | 2011-023729 | 2/2011 |
| JP | 2012-064818 | 3/2012 |
| WO | WO 2007/015355 A | 2/2007 |
| WO | WO 2009-133650 A1 | 5/2009 |

OTHER PUBLICATIONS

U.S. Appl. No. 12/235,237, filed Sep. 16, 2011, Kitagawa et al.
U.S. Appl. No. 13/236,028, filed Sep. 19, 2011, Nishiyama et al.
U.S. Appl. No. 14/160,419, filed Jan. 21, 2014, Kitagawa et al.
Yakushiji et al., "High Magnetoresistance Ratio and Low Resistance-Area Product in Magnetic Tunnel Junctions with Perpendicularly Magnetized Electrodes," Applied Physics Express, 3, 053003, 2010.
Japanese Office Action for Japanese Patent Application 2010-208616, mailed Sep. 11, 2012.
International Search Report and Written Opinion dated Aug. 28, 2012 for PCT International Application No. PCT/JP2012/063574 filed May 21, 2012.
International Preliminary Report on Patentability dated Feb. 6, 2014 for PCT International Application No. PCT/JP2012/063574 filed May 21, 2012.
Office Action dated Oct. 9, 2014, in U.S. Appl. No. 14/160,419.
Japanese Office Action dated Feb. 3, 2015 for JP Application No. 2012-105812.
Japanese Office Action dated Jun. 30, 2015 for JP Application No. 2012-105812, 11 pgs.

* cited by examiner

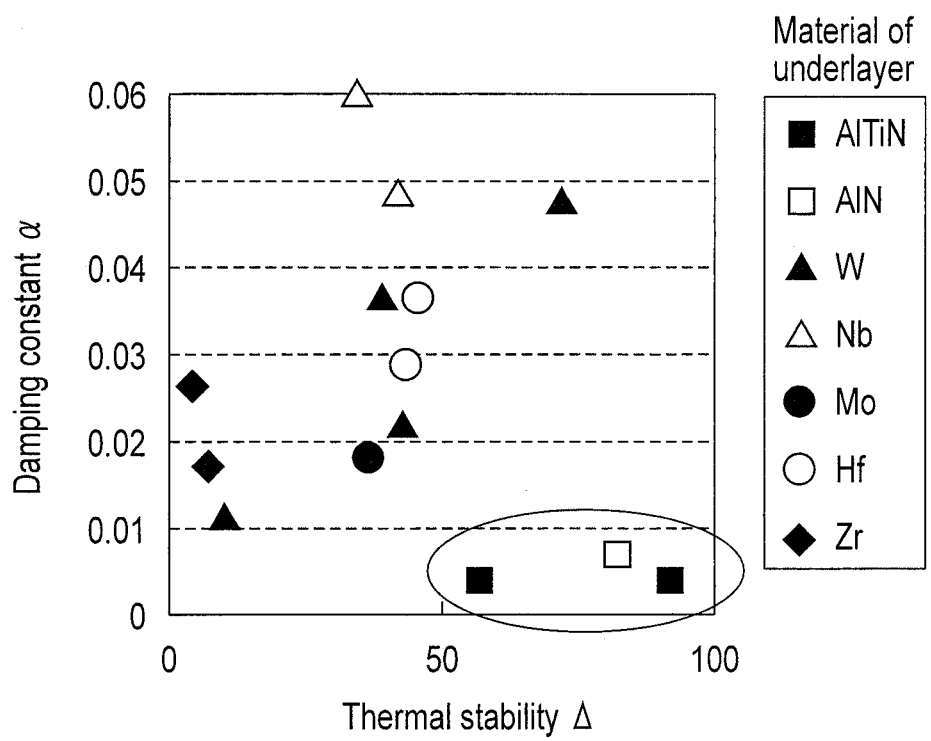
F I G. 2
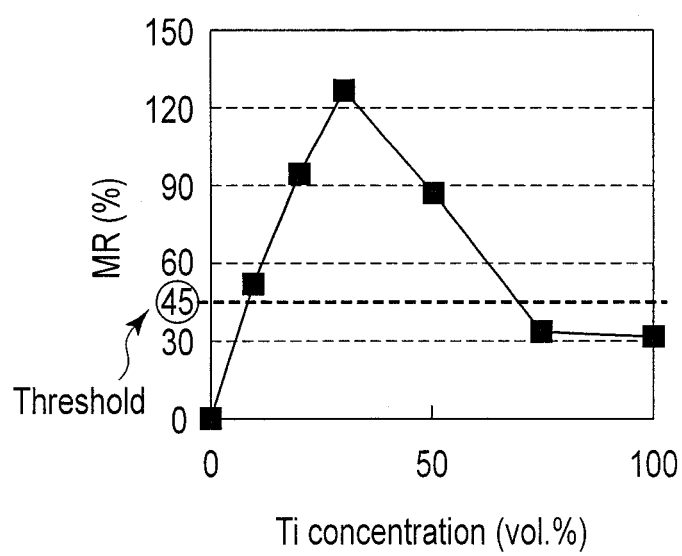
F I G. 3

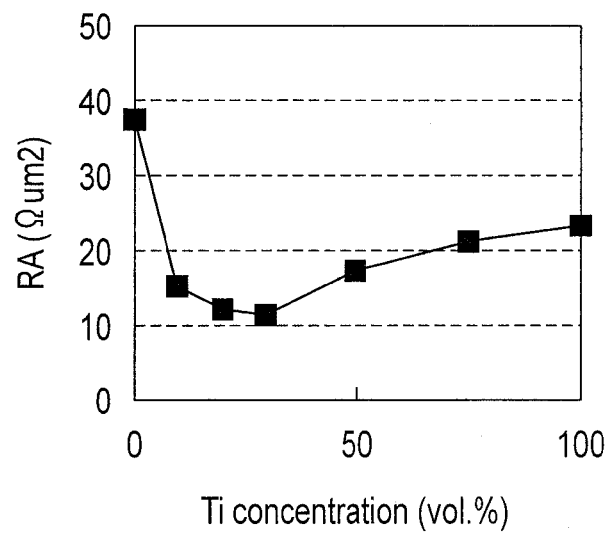
F I G. 5
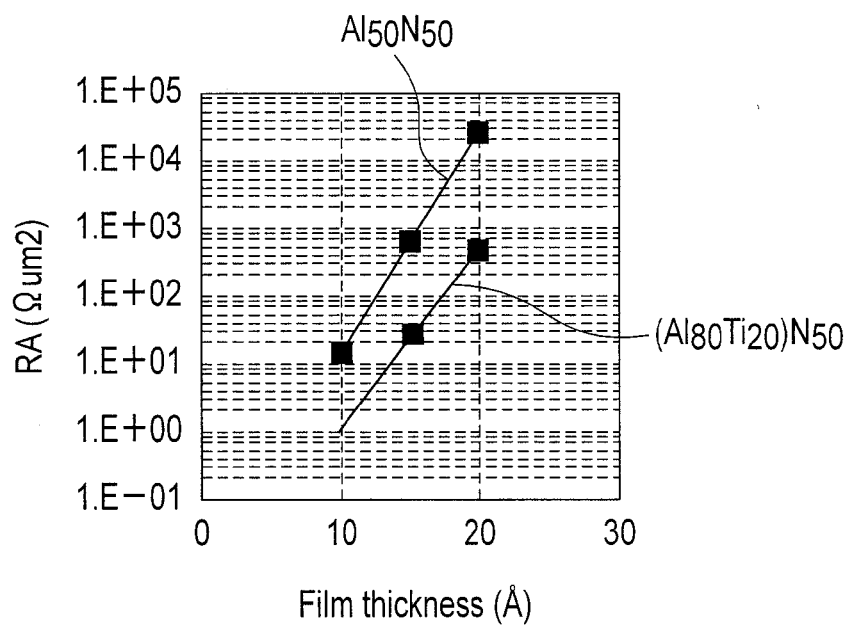
F I G. 6

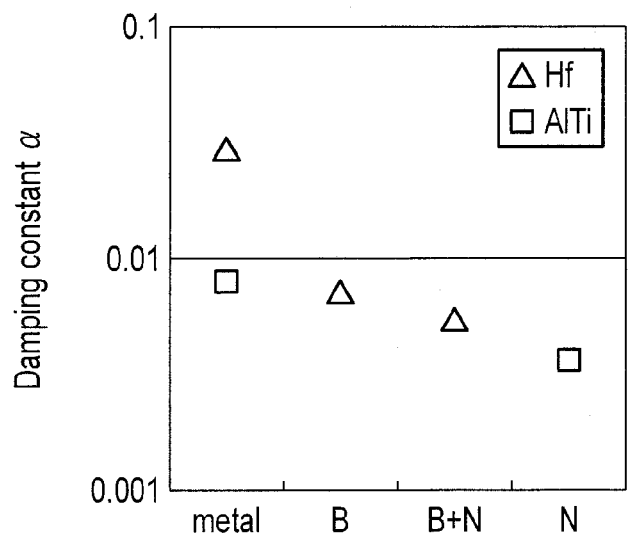
F I G. 13 A
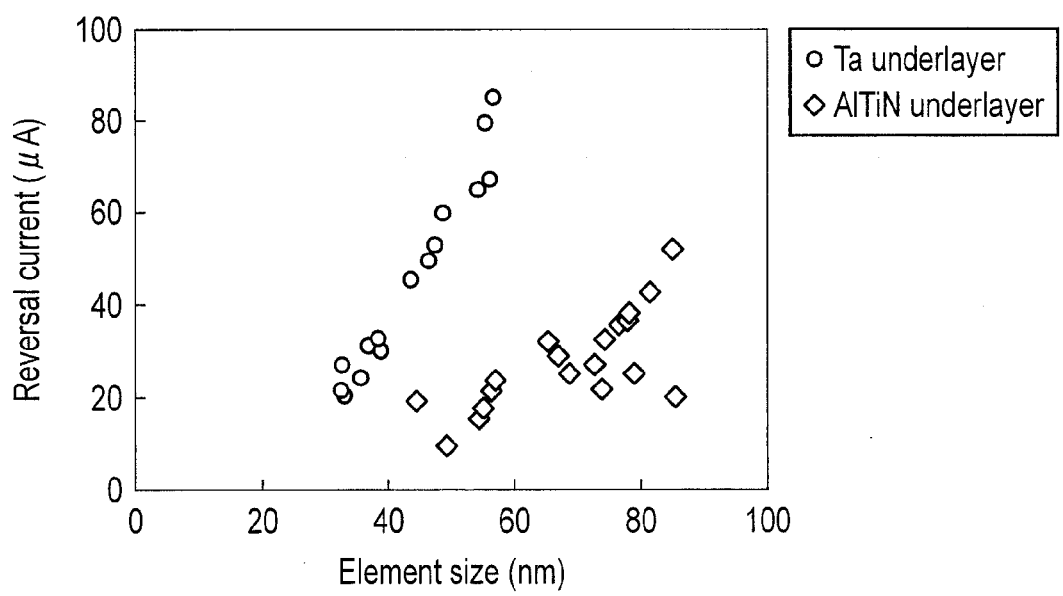
F I G. 13 B

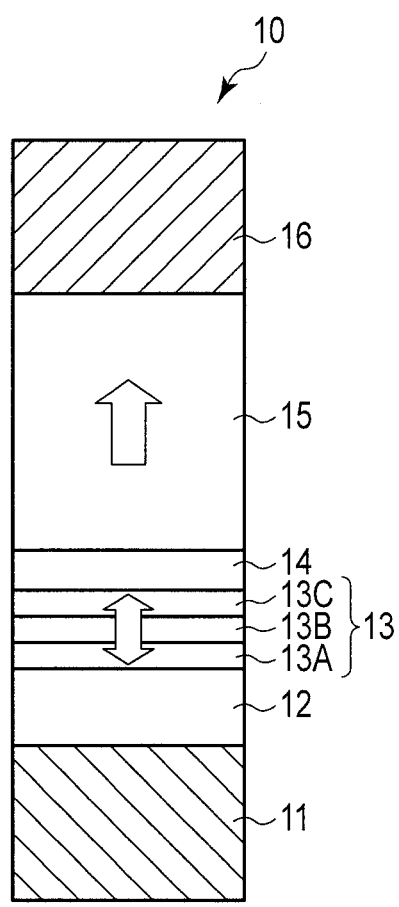
F I G. 15

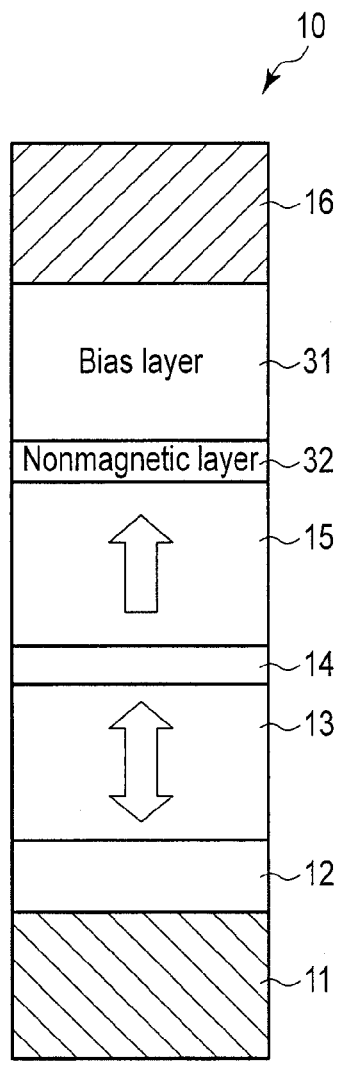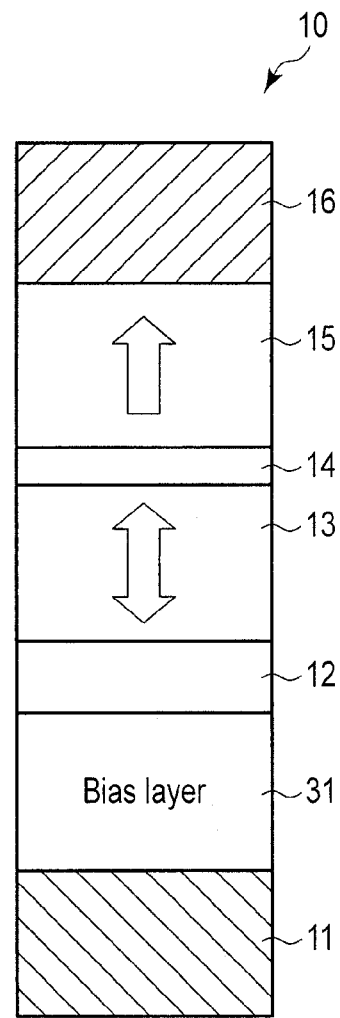
F I G. 18        F I G. 19

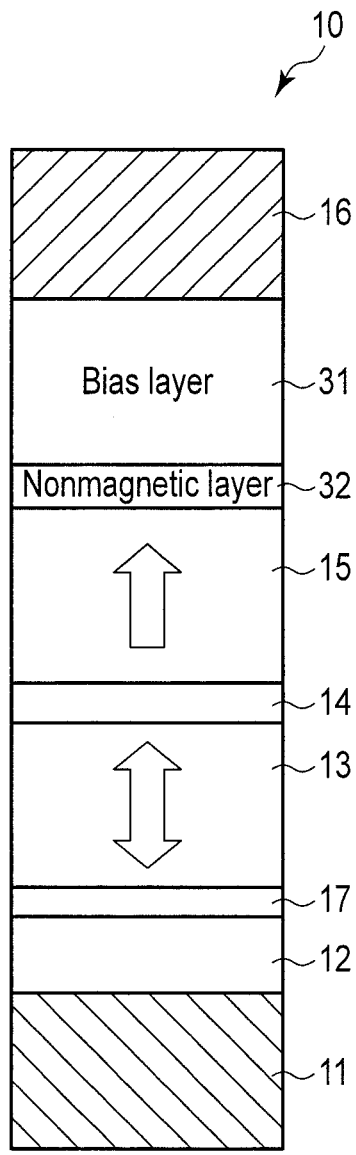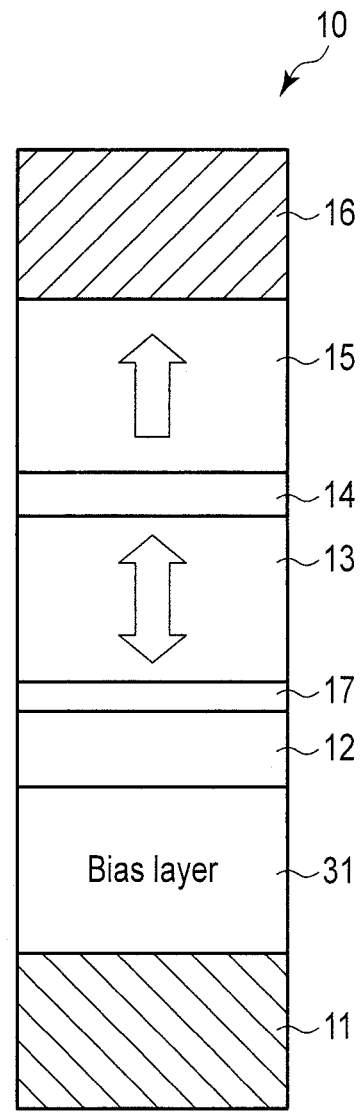
F I G. 20 A  F I G. 20 B

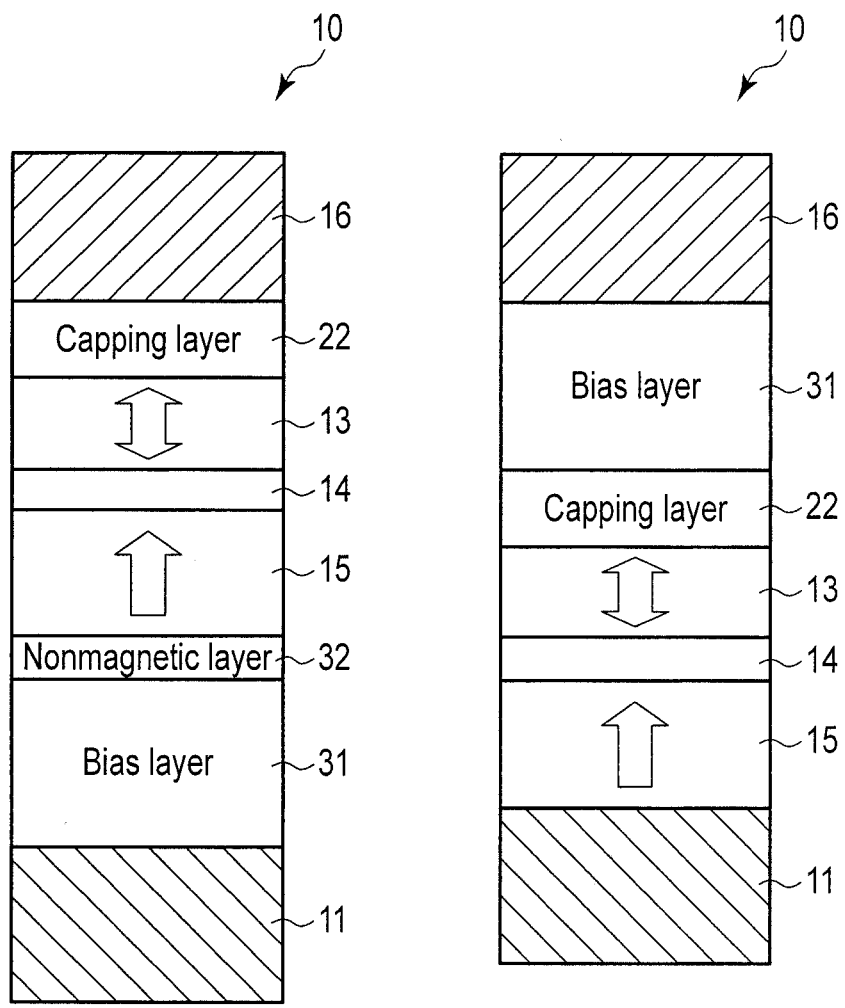
F I G. 2 1 A    F I G. 2 1 B

MAGNETORESISTIVE ELEMENT

CROSS REFERENCE TO RELATED APPLICATIONS

This application is a continuation of U.S. application Ser. No. 14/160,419, which was filed on Jan. 21, 2014 and is titled "MAGNETORESISTIVE ELEMENT," and which is a continuation of International Application No. PCT/JP2012/063574, filed May 21, 2012, which is based upon and claims the benefit of priority from Japanese Patent Application No. 2011-160806, filed Jul. 22, 2011, and Japanese Patent Application No. 2012-105812, filed May 7, 2012, the entire contents of all of which are incorporated herein by reference.

FIELD

Embodiments described herein relate generally to a magnetoresistive element.

BACKGROUND

A spin transfer torque MRAM (Magnetic Random Access Memory) using a perpendicular magnetization film for a recording layer is advantageous in order to decrease a write current and increase the capacity. A stacked film consisting of cobalt (Co) and platinum (Pt) each having a dense atomic plane has high crystal magnetic anisotropy of $10^7$ erg/cm$^2$, and can achieve a high magnetoresistive ratio (MR ratio) with low resistivity. Such stacked film is, therefore, receiving attention as a technique for achieving large scale integrated MRAM.

On the other hand, in terms of crystal structure, ruthenium (Ru) is used as an underlayer made of a CoPt alloy. The Ru underlayer increases the damping constant of a recording layer. This undesirably increases a write current. In a spin transfer torque MRAM using a perpendicular magnetization film, a write current increases in proportion with the damping constant, in inverse proportion with the spin polarizability, and in proportion with the area. A technique of decreasing the damping constant, increasing the spin polarizability, and reducing the area is necessary for decreasing the write current.

BRIEF DESCRIPTION OF THE DRAWINGS

FIG. 2 is a graph showing the magnitude of a damping constant $\alpha$ as a function of a thermal stability $\Delta$ when an underlayer made of each of various materials is used according to the first embodiment;

FIG. 3 is a graph showing an MR ratio (magnetoresistive ratio) as a function of a Ti content (X) of $Al_{(100-X)}Ti_XN$ of an underlayer according to the first embodiment;

FIG. 5 is a graph showing RA (resistance) as a function of a Ti content (X) of $Al_{(100-X)}Ti_XN$ of an underlayer according to the first embodiment;

FIG. 6 is a graph showing RAs (resistances) as a function of the film thickness of the underlayer when the Ti concentration is 0% ($Al_{50}N_{50}$) and when the Ti concentration is 20% (($Al_{80}Ti_{20})_{50}N_{50}$) according to the first embodiment;

FIG. 13A is a graph showing damping constants in various kinds of underlayers according to the third embodiment;

FIG. 13B is a graph showing a result of comparing magnetization reversal currents when a Ta underlayer is used and when an AlTiN underlayer is used according to the third embodiment;

FIG. 15 is a sectional view showing an MTJ element according to the fourth embodiment;

FIG. 18 is a sectional view showing an MTJ element according to the fifth embodiment;

FIG. 19 is a sectional view showing a modification of the MTJ element according to the fifth embodiment;

FIGS. 20A and 20B are sectional views showing modifications of the MTJ element according to the fifth embodiment; and FIGS. 21A and 21B are sectional views showing modifications of the MTJ element according to the fifth embodiment.

DETAILED DESCRIPTION

Figure 1:
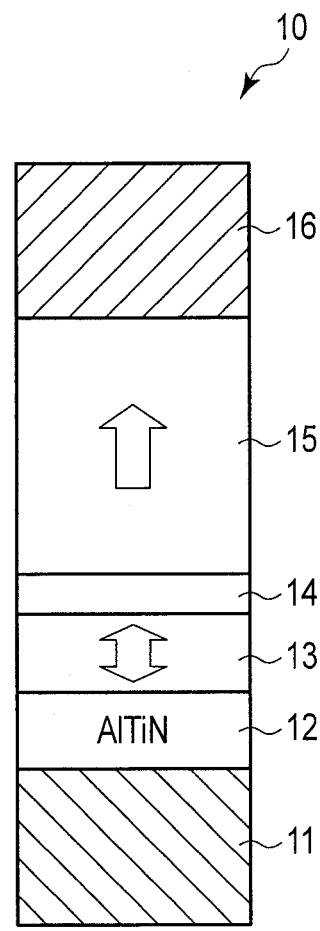
FIG. 1 is a sectional view showing an MTJ element according to the first embodiment.

In general, according to one embodiment, a magnetoresistive element comprises a recording layer having magnetic anisotropy perpendicular to a film surface and having a variable magnetization direction, a reference layer having magnetic anisotropy perpendicular to a film surface and having an invariable magnetization direction, an intermediate layer provided between the recording layer and the reference layer, and an underlayer containing AlTiN and provided on the opposite side of the surface of the recording layer on which the intermediate layer is provided.

Embodiments will be described below with reference to the accompanying drawings. Note that the drawings are diagrammatic and schematic and dimensions and ratios in each drawing are not necessarily to scale. When the same portions are shown in the drawings, their dimensions and ratios may be represented differently. In some embodiments to be described below, a magnetoresistive element for implementing the technical principles of the present embodiment is exemplified, and the shapes, structures, arrangements, and the like of components do not limit the technical principles of the present embodiment. Note that the same reference numerals denote elements having the same functions and arrangements in the following description, and a repetitive description will be made only when necessary.

[1] First Embodiment

[1-1] Arrangement of MTJ Element 10

The arrangement of the MTJ element 10 as a magnetoresistive element according to the first embodiment will be described with reference to FIG. 1.

The MTJ element 10 includes a lower electrode 11, an underlayer 12, a recording layer 13, an intermediate layer 14, a reference layer 15, and an upper electrode 16 which are sequentially stacked from the bottom.

Each of the recording layer 13 and reference layer 15 is made of a ferromagnetic material, and has magnetic anisotropy perpendicular to a film surface. The directions of easy magnetization of the recording layer 13 and reference layer 15 are perpendicular to the film surfaces. That is, the MTJ element 10 is a perpendicular magnetization type MTJ element in which the magnetization directions of the recording layer 13 and reference layer 15 are perpendicular to the film surfaces. Note that the direction of easy magnetization is the direction of spontaneous magnetization in which the internal energy of an assumed ferromagnetic material having a certain macro size is minimized without an external magnetic field. The direction of hard magnetization is the direction of spontaneous magnetization in which the internal energy of an assumed ferromagnetic material having a certain macro size is maximized without an external magnetic field.

The magnetization (or spin) direction of the recording layer 13 is variable (reversible). The magnetization direction of the reference layer 15 is invariable (fixing). The reference layer 15 is set to have perpendicular anisotropy energy sufficiently larger than that of the recording layer 13. The anisotropy energy is settable by adjusting the material composition and film thickness. In this way, the magnetization reversal current of the recording layer 13 is decreased, and the magnetization reversal current of the reference layer 15 is increased to be larger than that of the recording layer 13. This can realize, for a predetermined write current, an MTJ element 10 which includes a recording layer 13 having a variable magnetization direction and a reference layer 15 having an invariable magnetization direction.

The intermediate layer 14 is made of a nonmagnetic material, and a nonmagnetic metal, a nonmagnetic semiconductor, an insulator, or the like can be used. When an insulator is used as the intermediate layer 14, it is called a tunnel barrier layer. When a metal is used as the intermediate layer 14, it is called a spacer layer.

The underlayer 12 has a function of improving the magnetic anisotropy of the recording layer 13. The damping constant of the recording layer 13 may increase depending on a material in contact with the recording layer 13. This is known as a spin pumping effect. The underlayer 12 has a function of decreasing the damping constant of the recording layer 13 by reducing the spin pumping effect.

The underlayer 12 is made of a nitrogen compound such as AlTiN. The underlayer 12 made of AlTiN is deposited by, for example, sputtering aluminum (Al) and titanium (Ti) using a mixed gas containing nitrogen ($N_2$) and argon (Ar). Alternatively, an alloy of aluminum and titanium may be sputtered using a mixed gas containing nitrogen ($N_2$) and argon (Ar). It is also possible to deposit the underlayer 12 by sputtering an aluminum titanium nitride using an argon (Ar) gas. The arrangement of the underlayer 12 will be described in detail below.

An example of the arrangement of the MTJ element 10 will be described below. In the following explanation, a numerical value inside the parentheses appended to an element indicates a film thickness, the unit of which is Å. A symbol "/" represents that an element to the left of "/" is stacked on an element to the right of "/".

The lower electrode 11 is made of Ta (200)/Cu (400)/Ti (100). The underlayer 12 is made of AlTiN (10). The recording layer 13 is made of FeB (14). The intermediate layer (tunnel barrier layer) 14 is made of MgO (10). The reference layer 15 is made of TbCoFe (120)/CoFeB (4)/Ta (3)/CoFeB (15). The upper electrode 16 is made of Ru (200)/Ta (50).

Note that the recording layer 13 may be made of CoFe or CoFeB instead of FeB. In this case, the concentration of Fe is desirably made higher than that of Co. Furthermore, the recording layer 13 may be made of Fe. Even if such recording layer 13 is made of CoFe or CoFeB in which the concentration of Fe is higher than that of Co, or FeB or Fe, it may contain other elements in the material, and need only contain the material as a major component. Using such material can improve the perpendicular magnetic anisotropy of the recording layer 13.

[1-2] Underlayer 12 Made of Nitrogen Compound

Conventionally, a technique of obtaining a damping constant α smaller than 0.01 while having high perpendicular magnetic anisotropy has been considered as one of the biggest issues in using a perpendicular magnetization film for the recording layer 13, and has been developed all over the world. However, it has been considered to be difficult to implement this technique. A write current is in proportion with the damping constant α. If, therefore, it is possible to decrease the damping constant α, it is also possible to decrease the write current.

The present applicant, however, has found an arrangement capable of solving the above problem. That is, it has been found that using a nitrogen compound such as AlTiN or AlN for the underlayer 12 of the recording layer 13, it is possible to decrease the damping constant α while keeping enough thermal stability Δ. This will be described in detail below.

FIG. 2 shows the magnitude of the damping constant α as a function of the thermal stability Δ when an underlayer 12 made of each of various materials is used. Note that a recording layer 13 with a size φ of 40 nm is used and AlTiN, AlN, W, Nb, Mo, Hf, or Zr is used as the material of the underlayer 12.

As is apparent from FIG. 2, when AlTiN or AlN is used as the material of the underlayer 12, it is possible to decrease its damping constant α to 0.008 or smaller. That is, when the material of the underlayer 12 is changed from a metal to a nitride (AlTiN or AlN), it is possible to decrease the magnitude of the damping constant α and to keep the thermal stability Δ high.

Since a nitride has high resistance to heat diffusion, it is possible to suppress the diffusion of the underlayer 12 and the recording layer 13, and a distribution in the magnetic characteristics of the MTJ element 10.

In terms of the above points, it is understood that it is effective to use a nitride as the material of the underlayer 12. Note that in addition to AlTiN and AlN, examples of an effective nitride for the underlayer 12 are ZrN, NbN, HfN, TaN, WN, and SiN. Since, however, AlTiN has a small number of 3d electrons, an insulating property, and a small number of free electrons, spin-orbit interaction with the recording layer 13 is weak and spin information transferred to the recording layer 13 is less likely to be lost in the underlayer 12. For the above reasons, AlTiN (AlN) among various nitrides is used as the underlayer 12.

[1-3] Ti Concentration with Respect to Al of Underlayer 12

In this embodiment, AlTiN (AlN) is used as the underlayer 12. Various characteristic changes of the MTJ element 10 along with a change in Ti concentration with respect to Al (the composition of AlTi) will be described. Note that a representation $[Al_{(100-X)}Ti_X]N$ may be used in this specification. For example, $Al_{80}Ti_{20}N$ indicates that the ratio between the element counts of Al and Ti is 80:20 and the ratio between the element counts of AlTi and nitrogen is 1:1.

FIG. 3 shows an MR ratio (magnetoresistive ratio) as a function of the Ti content (X) of $Al_{(100-X)}Ti_XN$ of the underlayer 12. The abscissa in FIG. 3 represents a Ti concentration (X) (vol. %) with respect to Al. The ordinate in FIG. 3 represents the MR ratio (%) of the MTJ element 10. Note that an underlayer 12 containing 50 at. % of nitrogen with respect to the total content of Al and Ti is used. "vol. %" represents a volume percentage concentration and "at. %" represents an atomic percentage.

As shown in FIG. 3, when the Ti concentration with respect to Al increases from 0% to 30%, the MR ratio increases. When the Ti concentration with respect to Al increases from 30% to 100%, the MR ratio decreases. It is found that the MR ratio of Ti-added AlN increases as compared with AlN (the Ti concentration is 0%).

In terms of the performance of the MRAM device, the MR ratio is desirably at least 45% or higher. From this point of view, the Ti concentration with respect to Al desirably falls within the range from 10% (inclusive) to 50% (inclusive). That is, if the underlayer 12 is made of $Al_{(100-X)}Ti_XN$, it is desirable to satisfy 10≤X≤50. The reason why the Ti concentration with respect to Al influences the MR ratio is as follows. If the Ti concentration with respect to Al is lower than 10% in AlN, the resistance of AlN increases and AlN is added to the intermediate layer 14 as a series resistance, thereby decreasing the MR ratio. On the other hand, if the Ti concentration is higher than 50%, the magnetic characteristics of the recording layer 13 degrade, thereby decreasing the MR ratio. Furthermore, if the Ti concentration falls within the range from 10% (inclusive) to 50% (inclusive), AlTiN has an amorphous structure. Therefore, the underlayer 12 is flat and the recording layer 13 and the intermediate layer 14 formed on the underlayer 12 are also flat, thereby increasing the MR ratio.

The ratio between AlTi and N in the underlayer 12 made of AlTiN is desirably 1:1. If the AlTi content with respect to N increases, AlTi and the recording layer 13 tend to diffuse, thereby degrading the perpendicular magnetic anisotropy of the recording layer 13. Electrons are set in a closed shell state when the content ratio of nitrogen and AlTi is 1:1, thereby achieving heat stabilization. The ratio between AlTi and N is, therefore, desirably 1:1.

Note that the underlayer 12 may contain elements other than Al, Ti, and N, and need only contain AlTiN as a major component.

[1-4] Consideration of Decrease in MR Ratio

As described above, when the Ti concentration of the underlayer 12 is equal to or higher than 50% or lower than 30%, the MR ratio decreases. A result of considering a cause of the decrease will be described.

A cause of a decrease in MR ratio when the Ti concentration of the underlayer 12 is equal to or higher than 50% will be explained first with reference to FIG. 4.

Figure 4:
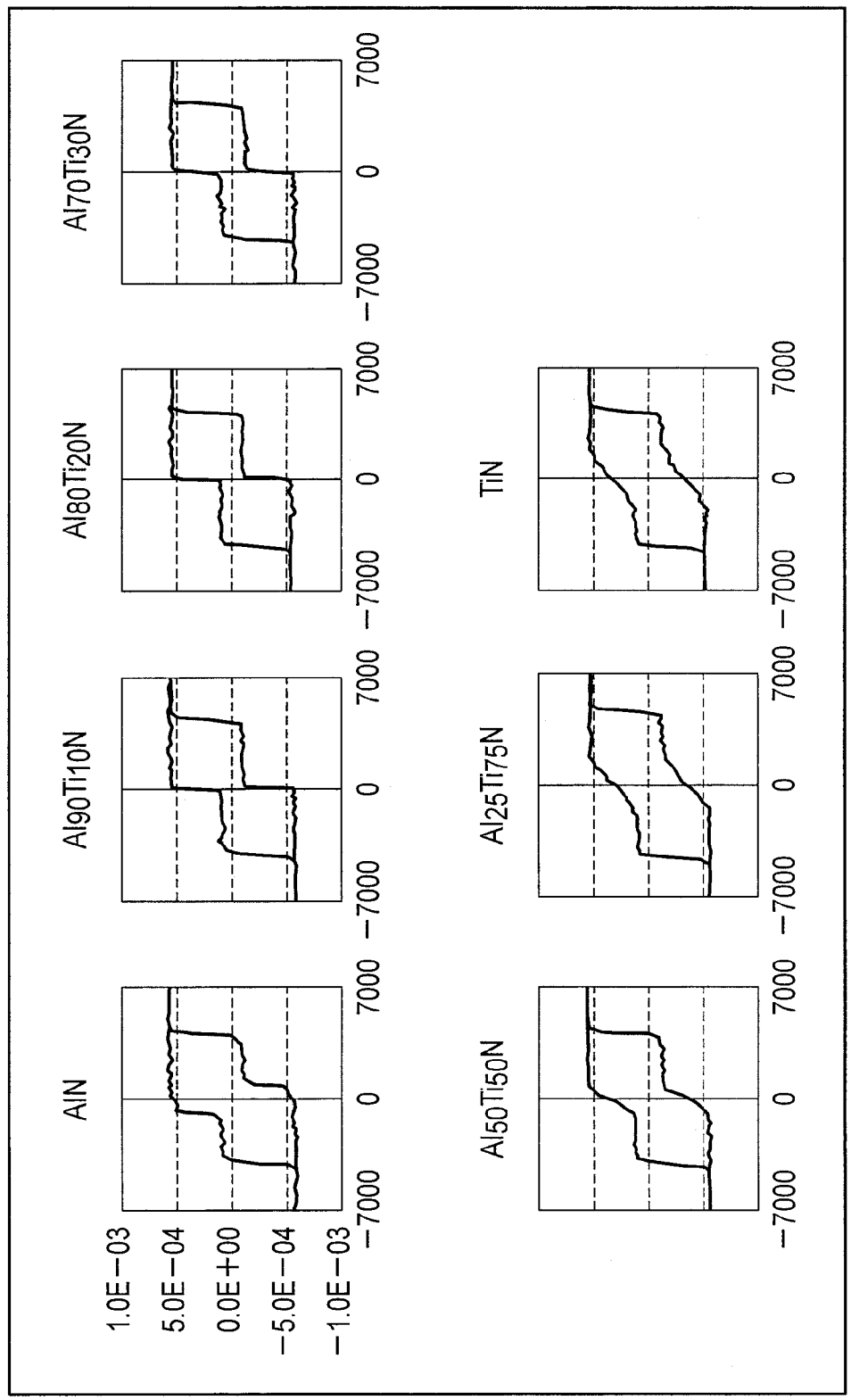
FIG. 4 shows graphs representing the magnetic characteristics (M-H curves) of the MTJ element when the concentrations of Al and Ti of the underlayer are changed according to the first embodiment.

FIG. 4 shows the magnetic characteristics (M-H curves) of the MTJ element 10 when the concentrations of Al and Ti of the underlayer 12 are changed. The abscissa in FIG. 4 represents a magnetic field (Oe) in a direction perpendicular to the film surface. The ordinate in FIG. 4 represents magnetization (emu) in a direction perpendicular to the film surface of the recording layer 13. Note that "E" in FIG. 4 indicates a base 10 exponential function.

Assume that the Ti concentration becomes 50% or higher. In this case, as shown in FIG. 4, when the abscissa (the magnetic field) is zero, the remanent magnetization ratio of the magnetization of the recording layer 13 is smaller than 1. That is, when the Ti concentration becomes 50% or higher, the perpendicular magnetic anisotropy of the recording layer 13 degrades, the remanent magnetization ratio of the recording layer 13 becomes smaller than 1, and it becomes impossible to set the magnetization directions of the recording layer 13 and the reference layer 15 to be parallel or antiparallel to each other, thereby decreasing the MR ratio.

A cause of a decrease in MR ratio when the Ti concentration of the underlayer 12 is lower than 30% will be described with reference to FIG. 5.

FIG. 5 shows RA (resistance) as a function of the Ti content (X) of $Al_{(100-X)}Ti_XN$ of the underlayer 12. The abscissa in FIG. 5 represents the concentration (X) (vol. %) of Ti with respect to Al. The ordinate in FIG. 5 represents the resistance RA ($\Omega\mu m^2$) of the MTJ element 10. Note that an the underlayer 12 containing 50 at. % of nitrogen with respect to the total content of Al and Ti is used.

As shown in FIG. 5, when the Ti concentration with respect to Al becomes lower than 30%, the resistance RA of the underlayer 12 increases, and the series resistance increases with respect to the resistance RA of the intermediate layer 14 of the MTJ element 10, thereby decreasing the MR ratio.

[1-5] Effectiveness of Ti-Added AlN

In this embodiment, it is desirable to use, for the underlayer 12, AlTiN obtained by adding Ti to AlN. The reason for this is as follows.

As is apparent from FIG. 3, when the Ti concentration is 0%, that is, when the underlayer 12 is made of AlN, the MR ratio is very low as compared with a case in which Ti is added. To increase the MR ratio, it is better to use, as the underlayer 12, AlTiN obtained by adding Ti to AlN as compared with AlN.

FIG. 6 shows RAs (resistances) as a function of the film thickness of the underlayer 12 when the Ti concentration is 0% ($Al_{50}N_{50}$) and when the Ti concentration is 20% (($Al_{80}Ti_{20})_{50}N_{50}$). The abscissa in FIG. 6 represents the film thickness (Å) of the underlayer 12. The ordinate in FIG. 6 represents the resistance RA ($\Omega\mu m^2$) of the underlayer 12.

It is apparent from FIG. 6 that it is possible to decrease the resistance RA of the underlayer 12 by about one order of magnitude when the Ti concentration is 20% (($Al_{80}Ti_{20})_{50}N_{50}$) as compared with a case in which the Ti concentration is 0% ($Al_{50}N_{50}$). When ($Al_{50}N_{50}$) is used, RA of MgO constituting the intermediate layer 14 is 10 $\Omega\mu m^2$, and RA of ($Al_{50}N_{50}$) having a thickness of 1 nm as the underlayer 12 is 10 $\Omega\mu m^2$ or larger. Since, therefore, the resistance of the underlayer 12 is added in series with the intermediate layer 14, the MR ratio becomes half or lower. On the other hand, when 20% of Ti are added to Al (($Al_{80}Ti_{20})_{50}N_{50}$), RA of (($Al_{80}Ti_{20})_{50}N_{50}$) having a thickness of 1 nm is 1 $\Omega\mu m^2$, and the resistance of the underlayer 12 to the intermediate layer 14 decreases, thereby enabling to suppress a decrease in MR ratio. The reason why MR is about several % when ($Al_{50}N_{50}$) is used as the underlayer 12 is that the resistance of the underlayer 12 was added in series with the intermediate layer 14 and that an increase in roughness due to isolation of the underlayer 12 exerted an influence.

[1-6] Effects

In the above-described first embodiment, a nitrogen compound (AlTiN) which can decrease the spin pumping effect is used for the underlayer 12. This can decrease the damping constant (friction constant) of the recording layer 13, thereby enabling to decrease a write current for the MTJ element 10.

In the first embodiment, a nitrogen compound (AlTiN) which has high resistance to heat diffusion is used as the underlayer 12. This can suppress the diffusion of the underlayer 12 and recording layer 13 and a distribution in the magnetic characteristics of the MTJ element 10.

In the underlayer 12 made of AlTiN, by setting the Ti concentration with respect to Al to fall within the range from 10% (inclusive) to 50% (inclusive), it is possible to realize an MTJ element 10 for which an effective MR ratio is ensured in terms of the device characteristics.

[1-7] Modifications

Figures 7A, 7B:
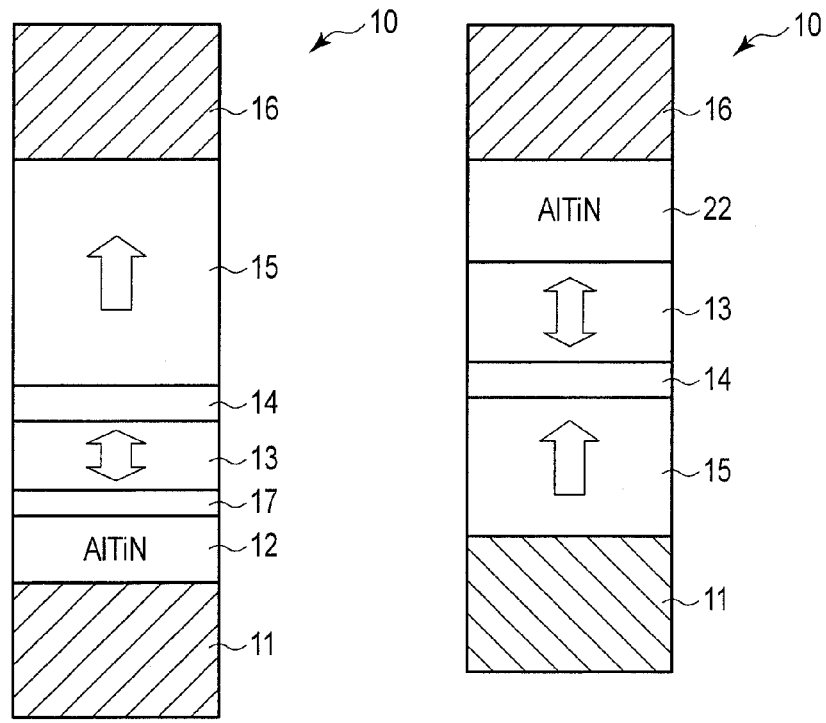
FIGS. 7A and 7B are sectional views showing modifications of the MTJ element according to the first embodiment.

The first embodiment can be modified to have the arrangement of the MTJ element 10 shown in FIGS. 7A and 7B.

As shown in FIG. 7A, a thin underlayer 17 may be provided between the recording layer 13 and underlayer 12. An example of the underlayer 17 is iridium (Ir) having a film thickness of 1 nm or smaller. Since a thick Ir layer increases the damping constant of the recording layer 13, the film thickness of the Ir layer is desirably 1 nm or smaller. In addition to iridium (Ir), palladium (Pd), platinum (Pt), and the like can be used as the material of the underlayer 17. Note that it is necessary to make the underlayer 17 thin so as not to increase the damping constant of the recording layer 13. According to the arrangement shown in FIG. 7A, it is possible to further improve the perpendicular magnetic anisotropy of the recording layer 13.

As shown in FIG. 7B, an AlTiN layer may be used as a capping layer 22 of the recording layer 13 instead of the underlayer 12 of the recording layer 13. That is, the MTJ element 10 includes the lower electrode 11, the reference layer 15, the intermediate layer 14, the recording layer 13, the capping layer 22, and the upper electrode 16 which are sequentially stacked from the bottom. The capping layer 22 is made of the same material as that of the above-described underlayer 12. According to a so-called bottom pin structure shown in FIG. 7B, it is possible to obtain the effects of decreasing a write current, improving the perpendicular magnetic anisotropy of the MTJ element 10, and decreasing a variation in the write current, similarly to a so-called top pin structure shown in FIG. 1.

In the modification shown in FIG. 7B, a magnetic layer made of the same material as that of the underlayer 17 may be inserted between the recording layer 13 and the capping layer 22, similarly to the arrangement shown in FIG. 7A. This can further improve the perpendicular magnetic anisotropy of the recording layer 13.

[2] Second Embodiment

In the second embodiment, it is possible to use TiN for an underlayer 12 by controlling the material of a film in contact with the underlayer 12.

[2-1] Arrangement of MTJ Element 10

Figure 8:
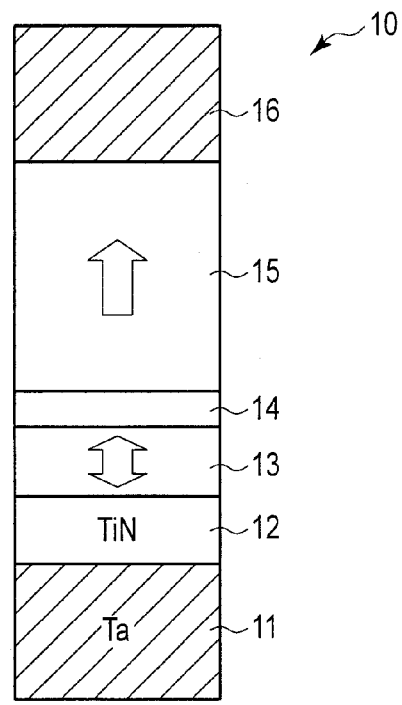
FIG. 8 is a sectional view showing an MTJ element according to the second embodiment.

The arrangement of the MTJ element 10 according to the second embodiment will be described with reference to FIG. 8.

The second embodiment is different from the first embodiment in that TiN is used as the underlayer 12, and an oxidizable material is used as a lower electrode 11, which means that when the lower electrode 11 is exposed to the atmosphere, its surface or the whole forms an oxide at room temperature. Using an oxidizable material for the lower electrode 11 on which the underlayer 12 is deposited improves the wettability of the underlayer 12 and lower electrode 11, and the flatness of the lower electrode 11, thereby forming a uniform underlayer 12.

The oxidizable material of the lower electrode 11 desirably contains one element selected from the group consisting of, for example, Al, Si, Ti, V, Cr, Zr, Nb, Hf, Ta, W, Ge, Ga, B, and Mg.

When the underlayer 12 made of TiN is used, a layer made of an oxidizable material is not limited to the lower electrode 11. That is, a layer made of an oxidizable material need only be in direct contact with the opposite side of the surface of the underlayer 12 on which a recording layer 13 is provided. For example, a layer made of an oxidizable material may be provided between the underlayer 12 and the lower electrode 11.

[2-2] Underlayer 12 Made of TiN

Figure 9:
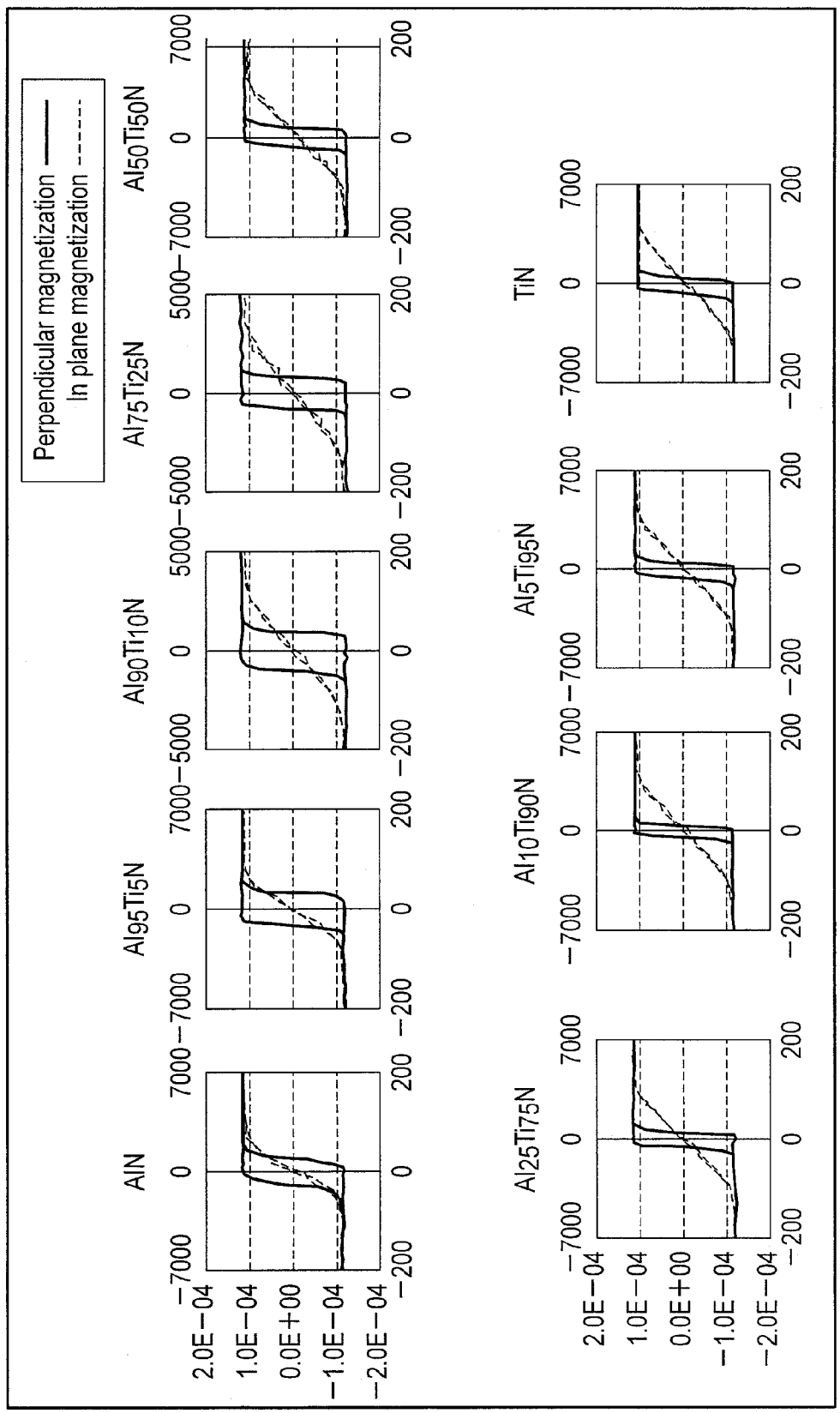
FIG. 9 shows graphs representing magnetic characteristics (M-H curves) of the MTJ element when a lower electrode made of Ta is used and the concentrations of Al and Ti of an underlayer are changed according to the second embodiment.

FIG. 9 shows the magnetic characteristics (M-H curves) of the MTJ element 10 when the concentrations of Al and Ti of the underlayer 12 are changed using a lower electrode 11 made of Ta. Note that the range from −200 to 200 on the abscissa in FIG. 9 indicates a magnetic field (Oe) applied in a direction perpendicular to a film surface, and the range from −5000 to 5000 or from −7000 to 7000 indicates a magnetic field (Oe) applied in an in-plane direction. The ordinate in FIG. 9 represents the magnetizations (emu) of the recording layer 13 in the direction perpendicular to the film surface and the in-plane direction. A solid line indicates the magnetic characteristics when the magnetic field is applied in the direction perpendicular to the film surface, and a dotted line indicates the magnetic characteristics when the magnetic field is applied in the in-plane direction.

As shown in FIG. 9, when the underlayer 12 is made of TiN, the magnetization in a direction perpendicular to the film surface does not decrease at 0 of the abscissa (magnetic field) of the magnetic characteristics. The remanent magnetization ratio as the ratio between the saturation magnetization and the remanent magnetization is nearly 1. That is, even if the underlayer 12 is made of TiN, using the lower electrode 11 made of Ta enables to maintain the perpendicular magnetic characteristics, thereby allowing to suppress a decrease in MR ratio for AlN added with 50% or more of Ti.

Figure 10C:
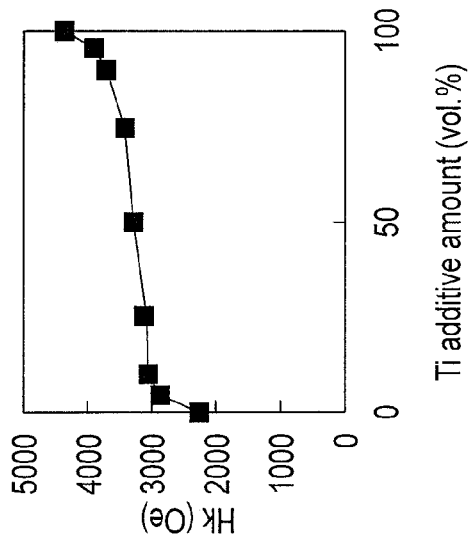
FIGS. 10A, 10B and 10C show graphs representing the saturation magnetization Ms (emu/cc) of a recording layer, the coercive force Hc (Oe) of the recording layer, and the magnetic anisotropy field Hk (Oe) when the concentrations of Al and Ti of the underlayer are changed according to the second embodiment.
Figure 10B:
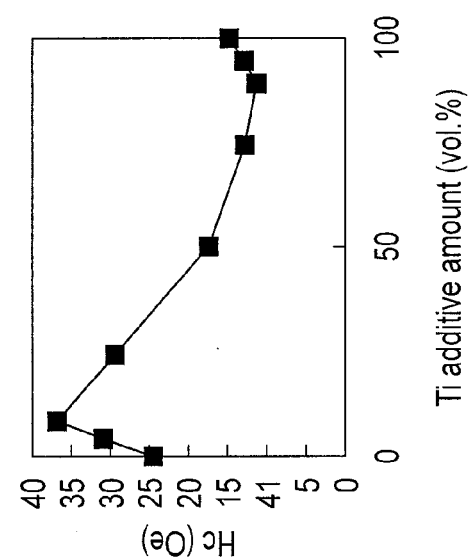
Figure 10A:
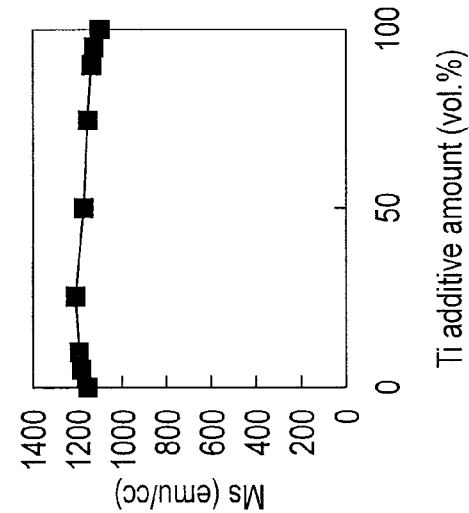

FIGS. 10A, 10B and 10C show the saturation magnetization Ms (emu/cc) of the recording layer 13, the coercive force Hc (Oe) of the recording layer 13, and the magnetic anisotropy field Hk (Oe) when the concentration of Ti of the underlayer 12 with respect to Al is changed.

As shown in FIGS. 10A, 10B and 10C, if the concentration of Ti is made high, the saturation magnetization Ms is nearly invariable, the coercive force Hc of the recording layer 13 decreases, and the magnetic anisotropy field Hk increases. This is probably because exchange coupling between spins or between particles is weak.

[2-3] Effects

In the above-described second embodiment, a nitrogen compound (TiN) which can decrease the spin pumping effect is used for the underlayer 12. This can decrease the damping constant (friction constant) of the recording layer 13, thereby enabling to decrease a write current for the MTJ element 10.

In the second embodiment, a nitrogen compound (TiN) which has high resistance to heat diffusion is used as the underlayer 12. This can suppress the diffusion of the underlayer 12 and recording layer 13, and a variation in the magnetic characteristics of the MTJ element 10.

An oxidizable material such as Ta is used as the lower electrode 11 in contact with the underlayer 12. This can reduce the roughness of the underlayer 12 and recording layer 13, and suppress degradation in perpendicular magnetic anisotropy, thereby ensuring an effective MR ratio.

[2-4] Modifications

Figure 11A:
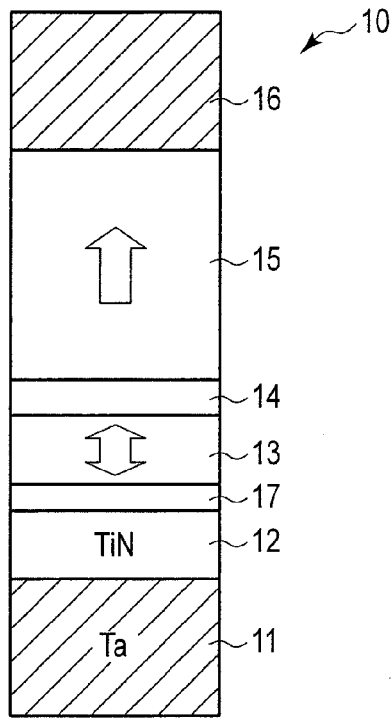
FIGS. 11A and 11B are sectional views showing modifications of the MTJ element according to the second embodiment.
Figure 11B:
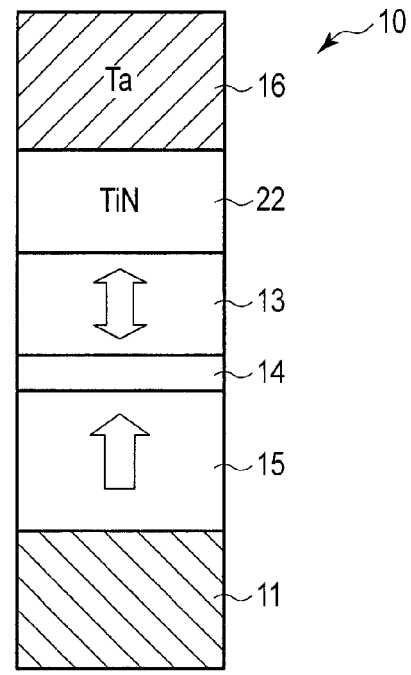

The second embodiment can be modified to have the arrangement of the MTJ element 10 shown in FIGS. 11A and 11B.

As shown in FIG. 11A, a thin underlayer 17 may be provided between the recording layer 13 and the underlayer 12. An example of the underlayer 17 is iridium (Ir) having a film thickness of 1 nm or smaller. Since a thick Ir layer increases the damping constant of the recording layer 13, the film thickness of the Ir layer is desirably 1 nm or smaller. In addition to iridium (Ir), palladium (Pd), platinum (Pt), and the like can be used as the material of the underlayer 17. Note that it is necessary to make the underlayer 17 thin so as not to increase the damping constant of the recording layer 13. According to the arrangement shown in FIG. 11A, it is possible to further improve the perpendicular magnetic anisotropy of the recording layer 13.

As shown in FIG. 11B, a TiN layer may be used as a capping layer 22 of the recording layer 13 instead of the underlayer of the recording layer 13. That is, the MTJ element 10 includes the lower electrode 11, a reference layer 15, an intermediate layer 14, the recording layer 13, the capping layer 22, and an upper electrode 16 which are sequentially stacked from the bottom. The capping layer 22 is made of the same material as that of the above-described underlayer 12. The upper electrode 16 in direct contact with the capping layer 22 is made of the above-described oxidizable material. According to a so-called bottom pin structure shown in FIG. 11B, it is possible to obtain the effects of decreasing a write current, improving the perpendicular magnetic anisotropy of the MTJ element 10, and decreasing a variation in the write current, similarly to a so-called top pin structure shown in FIG. 8.

In the modification shown in FIG. 11B, a magnetic layer made of the same material as that of the underlayer 17 may be inserted between the recording layer 13 and the capping layer 22, similarly to the arrangement shown in FIG. 11A. This can further improve the perpendicular magnetic anisotropy of the recording layer 13.

It is also possible to apply, to the first embodiment, the lower electrode 11 made of the material according to this embodiment.

[3] Third Embodiment

In the third embodiment, a boride is used as an underlayer 12.

[3-1] Arrangement of MTJ Element 10

Figure 12:
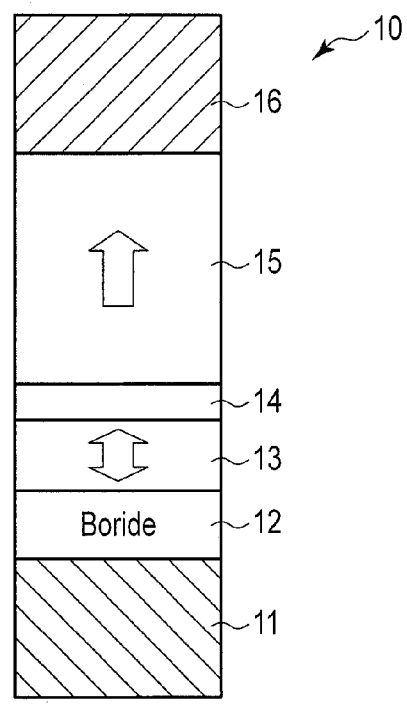
FIG. 12 is a sectional view showing an MTJ element according to the third embodiment.

The arrangement of the MTJ element 10 according to the third embodiment will be described with reference to FIG. 12.

The third embodiment is different from the first embodiment in that a boride is used as the material of the underlayer 12. More specifically, the underlayer 12 is made of a boride containing one element selected from the group consisting of Al, Si, Ti, V, Cr, Zr, Nb, Hf, Ta, W, Ge, and Ga.

[3-2] Underlayer 12 Made of Boride

A boride, as the material of the underlayer 12 of this embodiment, containing one element selected from the group consisting of Al, Si, Ti, V, Cr, Zr, Nb, Hf, Ta, W, Ge, and Ga is formed with a transition metal having a small number of d electrons such as Ti, V, Cr, Zr, Nb, Hf, Ta, or W, or a nontransition metal such as Al, Si, Ge, or Ga. It is, therefore, possible to decrease the damping constant, and to decrease the number of free electrons by boriding the material, thereby reducing spin-orbit interaction occurring between a recording layer 13 and the underlayer 12. This is effective to decrease the damping constant.

Figure 13:
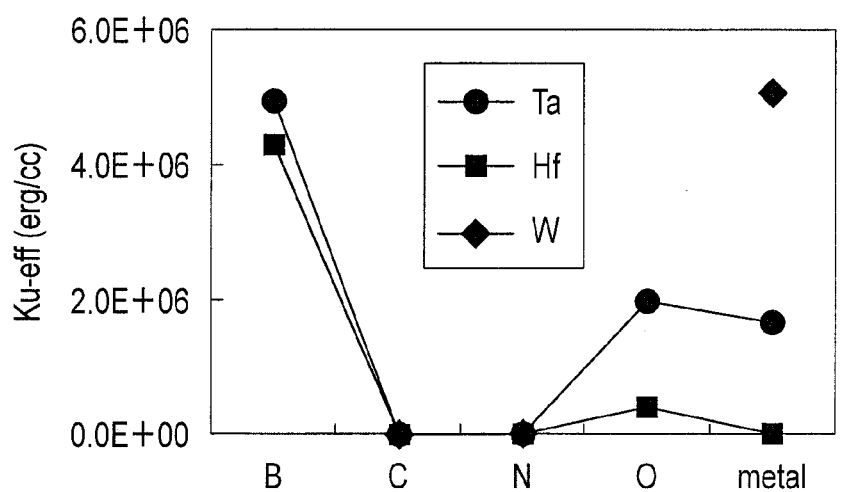
FIG. 13 is a graph showing a result of evaluating the perpendicular effective magnetic anisotropy energy Ku-eff (erg/cc) of a recording layer using an underlayer made of a B, C, N, O, or metal compound of Ta, Hf, or W according to the third embodiment.

FIG. 13 is a graph showing a result of evaluating the perpendicular anisotropy energy Ku-eff (erg/cc) of the recording layer 13 using an underlayer 12 made of a boride of Ta or Hf (TaB$_2$ or HfB$_2$) (denoted by "B" in FIG. 13), a carbide (TaC or HfC) (denoted by "C" in FIG. 13), a nitride (TaN or HfN) (denoted by "N" in FIG. 13), an oxide (TaO or HfO) (denoted by "O" in FIG. 13), or a metal of Ta, Hf, or W (elemental metal of Ta, Hf, or W) (denoted by "metal" in FIG. 13). As is apparent from FIG. 13, using an underlayer 12 made of a B compound (TaB or HfB) enables to obtain high perpendicular magnetic anisotropy of the recording layer 13.

FIG. 13A shows the damping constant of the recording layer 13 using each underlayer 12 when a compound of Hf and AlTi is formed using oxidation, boriding, nitriding, or both nitriding and boriding.

Comparing metal underlayers, a damping constant α of AlTi is smaller than that of Hf. This is because a light element is used as an underlayer material and the spin-orbit interaction between the underlayer and the recording layer reduces by changing 5d electrons of Hf to 3d electrons of Ti.

That is, a metal material containing a mixture of nitrogen and boron is desirably a 3d transition metal or a nontransition metal.

On the other hand, even when using a 5d transition metal, it is possible to decrease the damping constant using a boride or nitride. Although the damping constant α of an oxide or metal is high, it becomes 0.01 or smaller upon using a boride, nitride, or boron nitride, thereby sufficiently decreasing the damping constant. For a metal, the damping constant α takes a large value such as 0.01 or larger. This is because of diffusion of the underlayer and recording layer and the spin pumping effect of Hf. On the other hand, by nitriding or boriding, the spin of Hf disappears and the spin-orbit interaction between the recording layer and the underlayer reduces. This results in a decrease in the spin pumping effect, thereby enabling to decrease the damping constant.

Furthermore, since a boride has perpendicular magnetic anisotropy higher than those shown in FIG. 13, it is possible to manufacture a recording layer having a small damping constant and high record retention performance.

Table 1 shows various characteristics when HfB is used as an underlayer and when AlTiN is used as an underlayer.

Using an HfB underlayer makes it possible to obtain a high MR ratio. This is because a B-based material is used for the recording layer, so mixing the same class of element into the underlayer material decreases the interfacial energy between the underlayer and the recording layer, thereby enabling to manufacture a flat recording layer. As a result, it is possible to form a flat tunnel barrier layer, and to obtain a high MR ratio.

TABLE 1

| Underlayer | HfB | AlTiN | Ta |
|---|---|---|---|
| Recording layer | CoFeB (14Å) | FeB (14Å) | CoFeB(14Å) |
| damping constant | 0.007 | 0.004 | 0.02 |
| MR | 182% | 146% | 145% |

FIG. 13B is a graph showing a result of comparing magnetization reversal currents when a Ta underlayer is used and when an AlTiN underlayer is used.

Since the MRs of equivalent films are compared, the difference between the magnetization reversal currents is presumably attributed to the difference between damping constants to a large extent. It is found that the magnetization reversal current when the AlTiN underlayer is used is half or smaller as compared with a case in which the Ta underlayer is used. With the Ta underlayer, the damping constant between the recording layer and the underlayer increases due to an increase in damping constant of the recording layer because of diffusion and due to the spin pumping effect of the underlayer, thereby increasing a write current. With the AlTiN underlayer, since it is possible to suppress the diffusion and the spin pumping effect, the damping constant decreases and a write current also decreases. That is, it is possible to obtain nearly equal MRs using a nitride underlayer as compared with a metal underlayer, and it is also possible to decrease the magnetization reversal current and the write current. A boride underlayer can decrease the damping constant and obtain a high MR ratio as compared with a metal underlayer such as Ta.

As described above, the underlayer 12 made of a boride can improve the perpendicular magnetic anisotropy of the recording layer 13 while decreasing its damping constant.

[3-3] Effects

In the above-described third embodiment, a boride is used as the underlayer 12. This decreases the damping constant, thereby enabling to decrease a write current. It is also possible to improve the perpendicular magnetic anisotropy of the recording layer 13.

[3-4] Modifications

Figures 14A, 14B:
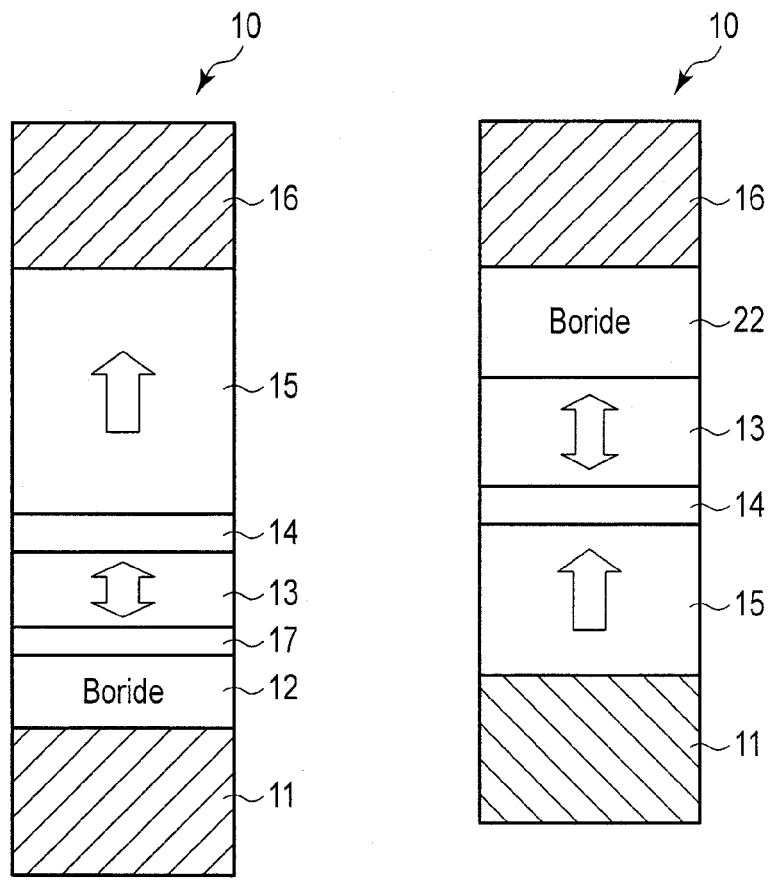
FIGS. 14A and 14B are sectional view showing modifications of the MTJ element according to the third embodiment.

The third embodiment can be modified to have the arrangement of the MTJ element 10 shown in of FIGS. 14A and 14B.

As shown in FIG. 14A, a thin underlayer 17 may be provided between the recording layer 13 and the underlayer 12. An example of the underlayer 17 is iridium (Ir) having a film thickness of 1 nm or smaller. Since a thick Ir layer increases the damping constant of the recording layer 13, the film thickness of the Ir layer is desirably 1 nm or smaller. In addition to iridium (Ir), palladium (Pd), platinum (Pt), and the like can be used as the material of the underlayer 17. Note that it is necessary to make the underlayer 17 thin so as not to increase the damping constant of the recording layer 13. According to the arrangement shown in FIG. 14A, it is possible to further improve the perpendicular magnetic anisotropy of the recording layer 13.

As shown in FIG. 14B, a boride layer may be used as a capping layer 22 of the recording layer 13 instead of the underlayer of the recording layer 13. That is, the MTJ element 10 includes a lower electrode 11, a reference layer 15, an intermediate layer 14, a recording layer 13, a capping layer 22, and an upper electrode 16 which are sequentially stacked from the bottom. The capping layer 22 is made of the same material as that of the above-described underlayer 12. According to a so-called bottom pin structure shown in FIG. 14B, it is possible to decrease a write current and improve the perpendicular magnetic anisotropy of the MTJ element 10, similarly to a so-called top pin structure shown in FIG. 12.

In the modification shown in FIG. 14B, a magnetic layer made of the same material as that of the underlayer 17 may be inserted between the recording layer 13 and the capping layer 22, similarly to the arrangement shown in FIG. 14A. This can further improve the perpendicular magnetic anisotropy of the recording layer 13.

[4] Fourth Embodiment

In the fourth embodiment, a recording layer 13 has a stacked structure using predetermined materials, and the perpendicular magnetic anisotropy of the recording layer 13 is improved.

[4-1] Arrangement of MTJ Element 10

FIG. 15 is a sectional view showing an example of the arrangement of the MTJ element 10 according to the fourth embodiment.

As shown in FIG. 15, the recording layer 13 has a stacked structure including a magnetic layer 13A on the underlayer 12 side, a magnetic layer 13C on the intermediate layer 14 side, and a nonmagnetic layer 13B provided between the magnetic layers 13A and 13C.

The magnetic layer 13A is desirably made of CoFe in which the concentration of Co is higher than that of Fe. This can improve the perpendicular magnetic anisotropy of the recording layer 13. Note that the concentration of Co in the magnetic layer 13A made of CoFe is preferably Co>50 at. % and, more preferably, Co≥90 at. %. This is because, if the concentration of Co is 50 at. % or higher, it is possible to obtain an MR ratio of 70% or higher, and if the concentration of Co is 90 at. % or higher, it is possible to obtain an MR ratio of 100% or higher. Furthermore, the magnetic layer 13A may be made of Co, CoB, FeB, or CoFeB in which the concentration of Co is higher than that of Fe.

The magnetic layer 13C is desirably made of CoFeB in which the concentration of Fe is higher than that of Co. This can improve the perpendicular magnetic anisotropy of the recording layer 13. The reason for this is as follows. That is, since the crystal structure of iron (Fe) is the bcc (body-centered cubic) structure and the crystal structure of cobalt (Co) is the hcp (hexagonal close-packed) structure, the crystal conformation of iron (Fe) with the intermediate layer (MgO) 14 is better than that of cobalt (Co). The magnetic layer 13C may be made of FeB.

From this point of view, it is possible to form an MTJ element 10 having a high MR ratio by adjusting the magnetic layer 13A on the underlayer 12 side of the recording layer 13 to be made of CoFe which contains Co at a high concentration, CoB, or FeB, and adjusting the magnetic layer 13C on the intermediate layer 14 side of the recording layer 13 to be made of CoFeB which contains Fe at a high concentration. Alternatively, when the magnetic layers 13A and 13C are mainly made of CoFe, it is possible to improve the perpendicular magnetic anisotropy of the recording layer 13 by making the concentration of Fe in the magnetic layer 13C higher than that in the magnetic layer 13A.

For the nonmagnetic layer 13B, a material containing one element selected from the group consisting of tantalum (Ta), niobium (Nb), titanium (Ti), zirconium (Zr), hafnium (Hf), tungsten (W), yttrium (Y), lanthanum (La), silicon (Si), and aluminum (Al). The material of the nonmagnetic layer 13B may be used as an additive for the recording layer 13 (FIG. 1 or the like) as a single layer or the magnetic layers 13A and 13C (FIG. 15 or the like) of the recording layer 13 having a stacked structure. Such nonmagnetic layer 13B can decrease the saturation magnetization Ms of the recording layer 13 to suppress stray magnetic field interference between neighboring bits, and can reduce a demagnetization field to improve the thermal stability.

Practical examples of the magnetic layer 13C/nonmagnetic layer 13B/magnetic layer 13A are CoFeB (8)/Ta (3)/CoFe (5), FeB/Ta/FeB, FeB/Ta/CoB, FeB/Nb/FeB, FeB/Nb/CoB, FeB/Ta/Co, and FeB/Ta/Co.

Note that if the film thickness of the nonmagnetic layer 13B inserted between the magnetic layers 13A and 13C increases, the spin scattering in the magnetic layers 13A and 13C increases, thereby causing an increase in write current. The film thickness of the nonmagnetic layer 13B, therefore, is desirably 1 nm or smaller.

By omitting the nonmagnetic layer 13B of FIG. 15, the recording layer 13 may be formed by two layers, that is, the magnetic layers 13A and 13C. For example, the magnetic layer 13A is made of CoFe or Co, and the magnetic layer 13C is made of CoFeB or FeB. The nonmagnetic layer 13B can increase the perpendicular magnetic anisotropy of the magnetic layer and the MR ratio but may cause an increase in damping constant. By omitting the nonmagnetic layer 13B, it is possible to make the damping constant of the magnetic layer small, and to decrease a write current. Note that by adjusting the compositions of the magnetic layers 13A and 13C forming the recording layer 13, it is possible to prevent degradation in the perpendicular magnetic anisotropy of the recording layer 13 due to the omission of the nonmagnetic layer 13B. It is possible to improve the MR ratio and the perpendicular magnetic characteristics of the recording layer 13 by making the concentration of Fe in the magnetic layer 13C on the intermediate layer 14 side higher than that in magnetic layer 13A on the underlayer 12 side. For example, it is possible to improve the MR ratio and the perpendicular magnetic characteristics of the recording layer 13 by using, as the recording layer 13, CoFeB (8)/CoFe (5) in which the concentration of Fe in the magnetic layer 13C is higher than that in the magnetic layer 13A, FeB (8)/CoFe (5), FeCoB (8)/Co (5), or FeB (8)/Co (5).

Note that the material of the above-described magnetic layer 13A, nonmagnetic layer 13B, or magnetic layer 13C may contain elements other than those in the above material, and need only contain the above material as a major component.

The same material as that of the underlayer 12 in the first to third embodiments can be used as the material of the underlayer 12 in the fourth embodiment.

[4-2] Recording Layer 13 Having Stacked Structure

Figure 16:
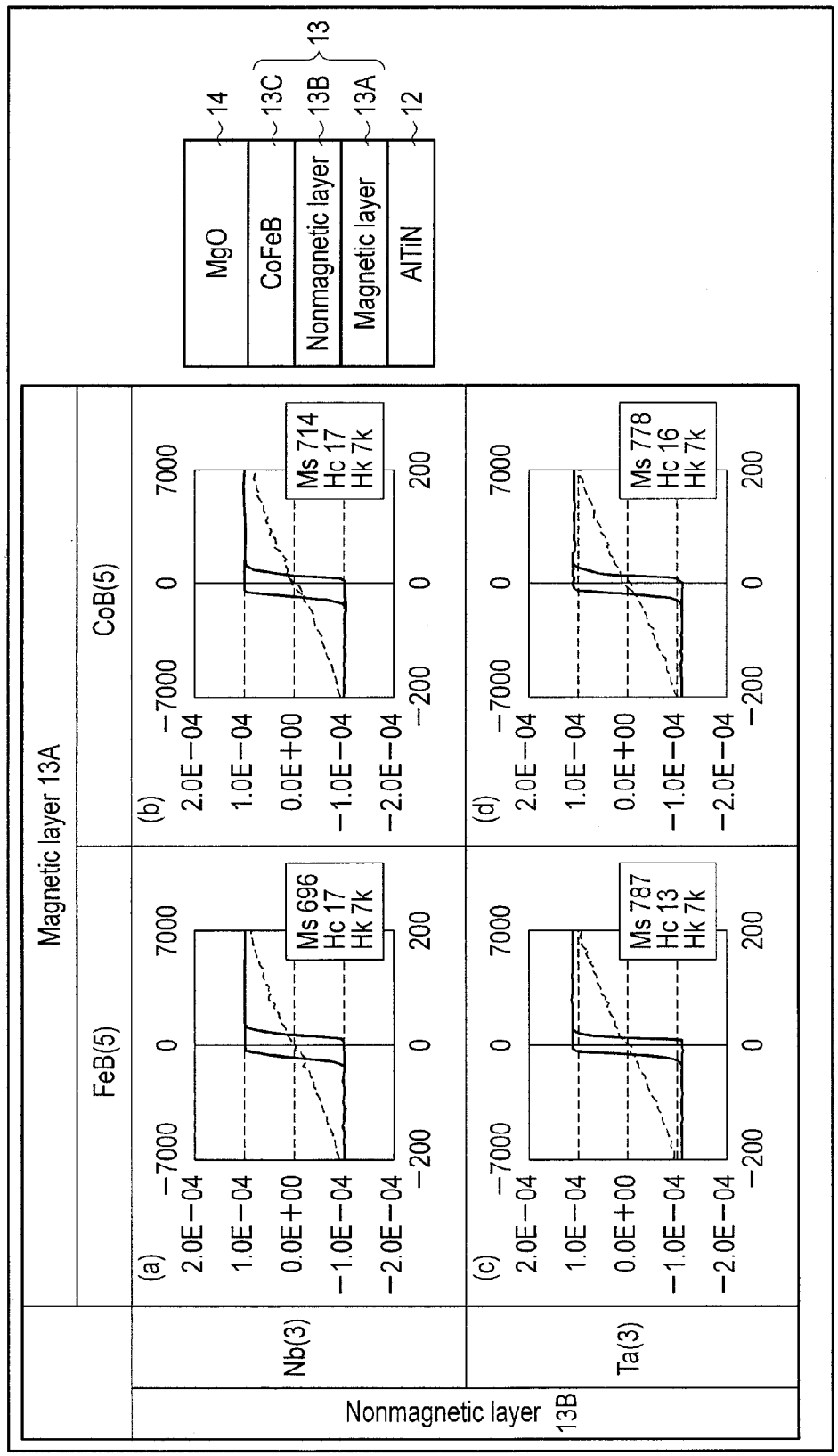
FIG. 16 is a view showing the magnetic characteristics (M-H curves) of the MTJ element when, in a recording layer including three layers, FeB or CoB is used as a magnetic layer and Nb or Ta is used as a nonmagnetic layer according to the fourth embodiment.

FIG. 16 shows the magnetic characteristics (M-H curves) of the MTJ element 10 when FeB or CoB is used as the magnetic layer 13A and Nb or Ta is used as the nonmagnetic layer 13B in the recording layer 13 including three layers. The range from −200 to 200 on the abscissa in FIG. 16 indicates a magnetic field (Oe) applied in a direction perpendicular to a film surface, and the range from −7000 to 7000 indicates a magnetic field (Oe) applied in an in-plane direction. The ordinate in FIG. 16 represents the magnetization (emu) of the recording layer 13 in the direction perpendicular to the film surface and the in-plane direction. A solid line indicates the magnetic characteristics when the magnetic field is applied in the direction perpendicular to the film surface, and a dotted line indicates the magnetic characteristics when the magnetic field is applied in the in-plane direction. Note that the underlayer 12 is made of AlTiN, the magnetic layer 13C is made of CoFeB, and the intermediate layer 14 is made of MgO.

As shown in FIG. 16, when AlTiN is used as the underlayer 12, it is possible to obtain a high magnetic anisotropy field Hk (7 k) by forming the magnetic layer 13C/nonmagnetic layer 13B/magnetic layer 13A of the recording layer 13 to have a stacked structure such as (a) CoFeB/Nb/FeB, (b) CoFeB/Nb/CoB, (c) CoFeB/Ta/FeB, or (d) CoFeB/Ta/CoB.

[4-3] Effects

According to the above-described fourth embodiment, the same effects as those in the first to third embodiments can be obtained.

In the fourth embodiment, the recording layer 13 formed on the underlayer 12 has the above-described stacked structure. This enables to improve the perpendicular magnetic characteristics of the recording layer 13 as well as the MR ratio of the MTJ element 10.

[4-4] Modifications

Figures 17A, 17B:
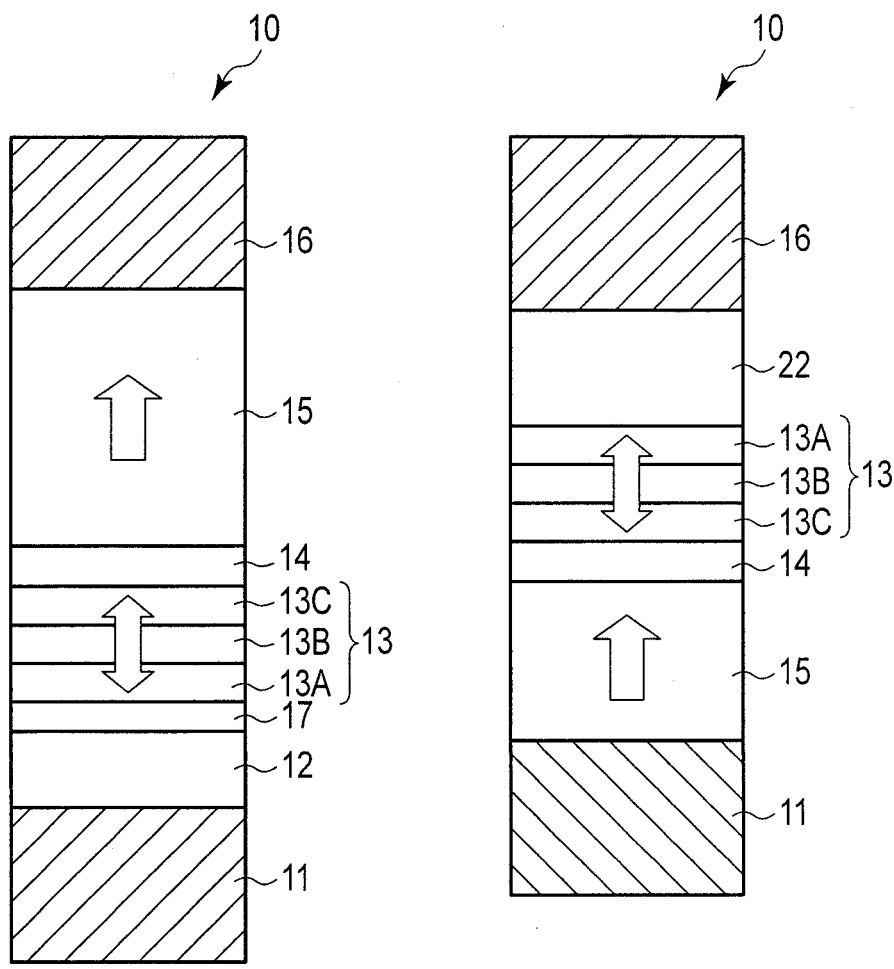
FIGS. 17A and 17B are sectional views showing modifications of the MTJ element according to the fourth embodiment.

The fourth embodiment can be modified to have the arrangement of the MTJ element 10 shown in FIGS. 17A and 17B.

As shown in FIG. 17A, a thin underlayer 17 may be provided between the recording layer 13 and the underlayer 12. An example of the underlayer 17 is iridium (Ir) having a film thickness of 1 nm or smaller. Since a thick Ir layer increases the damping constant of the recording layer 13, the film thickness of the Ir layer is desirably 1 nm or smaller. In addition to iridium (Ir), palladium (Pd), platinum (Pt), and the like can be used as the material of the underlayer 17.

Note that it is necessary to make the underlayer 17 thin so as not to increase the damping constant of the recording layer 13. According to the arrangement shown in FIG. 17A, it is possible to further improve the perpendicular magnetic anisotropy of the recording layer 13.

As shown in FIG. 17B, an AlTiN layer, a TiN layer, or a boride layer may be used as a capping layer 22 of the recording layer 13 instead of the underlayer of the recording layer 13. That is, the MTJ element 10 includes a lower electrode 11, a reference layer 15, the intermediate layer 14, the recording layer 13, the capping layer 22, and an upper electrode 16 which are sequentially stacked from the bottom. The capping layer 22 is made of the same material as that of the above-described underlayer 12. According to a so-called bottom pin structure shown in FIG. 17B, it is possible to obtain the effects of decreasing a write current, improving the perpendicular magnetic anisotropy of the MTJ element 10, and decreasing a variation in the write current, similarly to a so-called top pin structure shown in FIG. 15.

In the modification shown in FIG. 17B, a magnetic layer made of the same material as that of the underlayer 17 may be inserted between the recording layer 13 and the capping layer 22, similarly to the arrangement shown in FIG. 17A. This can further improve the perpendicular magnetic anisotropy of the recording layer 13.

[5] Fifth Embodiment

In the fifth embodiment, a bias layer 31 having a function of decreasing a magnetic stray field from a reference layer 15 is newly added to prevent a shift of a magnetic switching field of a recording layer 13 due to the magnetic stray field.

[5-1] Arrangement of MTJ Element 10

The arrangement of the MTJ element 10 according to the fifth embodiment will be described with reference to FIG. 18.

The MTJ element 10 of the fifth embodiment has an arrangement obtained by newly adding the bias layer 31 and a nonmagnetic layer 32 to the arrangement shown in FIG. 1.

The bias layer 31 is provided to prevent a shift of the magnetic switching field of the recording layer 13 due to the magnetic stray field from the reference layer 15, and a change in thermal stability between a case in which the magnetization arrangements of the reference layer 15 and recording layer 13 are in a parallel state and a case in which the magnetization arrangements are in an antiparallel state. It is possible to use, for the bias layer 31, the same perpendicular magnetization material as the reference layer 15.

The nonmagnetic layer 32 desirably provides antiferromagnetic coupling between the bias layer 31 and the reference layer 15 such that their magnetization directions are antiparallel to each other. The nonmagnetic layer 32 has heat resistance such that the bias layer 31 and reference layer 15 do not mix in a heat process, and a function of controlling the crystal orientation in forming the bias layer 31. A nonmagnetic metal containing ruthenium (Ru), silver (Ag), or copper (Cu) can be used as the nonmagnetic layer 32.

A magnetic layer made of CoFe, Co, Fe, CoFeB, CoB, FeB, or the like may be inserted between the bias layer 31 and the nonmagnetic layer 32 or between the reference layer 15 and the nonmagnetic layer 32. This makes it possible to reinforce the antiferromagnetic coupling between the bias layer 31 and the reference layer 15 via the nonmagnetic layer 32.

Note that the same material as that of the underlayer 12 in the first to third embodiments can be used as the material of an underlayer 12 in the fifth embodiment. The recording layer 13 may have the same arrangement as that in the fourth embodiment.

[5-2] Effects

According to the fifth embodiment, it is possible to obtain the same effects as those in the first to fourth embodiments.

In the fifth embodiment, the bias layer 31 can decrease the magnetic stray field from the reference layer 15. This can decrease a shift of the magnetic switching field of the recording layer 13 due to the magnetic stray field. As a result, it is possible to decrease a distribution in the magnetic reversal field of the recording layer 13 among the MTJ elements 10. By providing the bias layer 31, it is possible to firmly fix the magnetization of the reference layer 15 in one direction.

[5-3] Modifications

The fifth embodiment can be modified to have the arrangement of the MTJ element 10 shown in FIGS. 19, 20A, 20B, 21A and 21B.

As shown in FIG. 19, the bias layer 31 may be provided between a lower electrode 11 and the underlayer 12. In this case, by setting the magnetization of the bias layer 31 in the opposite direction to the reference layer 15, it is possible to decrease a magnetic stray field from the reference layer 15.

As shown in FIGS. 20A and 20B, a thin underlayer 17 may be provided between the recording layer 13 and underlayer 12. An example of the underlayer 17 is iridium (Ir) having a film thickness of 1 nm or smaller. Since a thick Ir layer increases the damping constant of the recording layer 13, the film thickness of the Ir layer is desirably 1 nm or smaller. In addition to iridium (Ir), palladium (Pd), platinum (Pt), and the like can be used as the material of the underlayer 17. Note that it is necessary to make the underlayer 17 thin so as not to increase the damping constant of the recording layer 13. According to the arrangement shown in FIGS. 20A and 20B, it is possible to further improve the perpendicular magnetic anisotropy of the recording layer 13.

As shown in FIGS. 21A and 21B, an AlTiN layer, a TiN layer, or a boride layer may be used as a capping layer 22 of the recording layer 13 instead of the underlayer of the recording layer 13. That is, the MTJ element 10 shown in FIG. 21A includes the lower electrode 11, the bias layer 31, the nonmagnetic layer 32, the reference layer 15, an intermediate layer 14, the recording layer 13, the capping layer 22, and an upper electrode 16 which are sequentially stacked from the bottom. The MTJ element 10 shown in FIG. 21B includes the lower electrode 11, the reference layer 15, the intermediate layer 14, the recording layer 13, the capping layer 22, the bias layer 31, and the upper electrode 16 which are sequentially stacked from the bottom. The capping layer 22 is made of the same material as that of the above-described underlayer 12. According to the structure shown in FIGS. 21A and 21B, it is possible to obtain the effects of decreasing a write current, improving the perpendicular magnetic anisotropy of the MTJ element 10, and decreasing a variation in the write current, similarly to the structure shown in FIG. 18.

In the modification shown in FIGS. 21A and 21B, a magnetic layer made of the same material as that of the underlayer 17 may be inserted between the recording layer 13 and the capping layer 22, similarly to the arrangement shown in FIGS. 20A and 20B. This can further improve the perpendicular magnetic anisotropy of the recording layer 13.

[6] Sixth Embodiment

The sixth embodiment attempts to improve an MR ratio using an underlayer 12 containing oxygen.

[6-1] Arrangement and Manufacturing Method of Underlayer 12

In the sixth embodiment, to form the underlayer 12 on a lower electrode 11, the following manufacturing method is performed.

For example, a Ta layer having a film thickness of 5 nm is deposited as the lower electrode 11, and radical oxidation is performed for the surface of the Ta layer for 100 sec, thereby forming a TaO layer. Etching is performed for the surface of the TaO layer. An AlTiN layer is deposited as the underlayer 12. By performing such manufacturing method, the underlayer 12 (for example, an AlTiNO layer) containing oxygen is formed.

As described above, oxidation is performed to form an oxide prior to deposition of the underlayer 12, but the sixth embodiment is not limited to this. For example, after the lower electrode 11 is deposited, one of nitriding, boriding, and carbonization may be performed for the surface of the lower electrode 11 to form a nitride, boride, or carbide. In this case, the underlayer 12 contains N, B, or C. In this embodiment, therefore, the underlayer 12 may contain one element selected from the group consisting of O, N, B, and C. Furthermore, at least one of the underlayer 12 and lower electrode 11 may contain one element selected from the group consisting of O, N, B, and C.

Note that the same material as that of the underlayer 12 in the first to third embodiments can be used as the material of the underlayer 12 in the sixth embodiment. A recording layer 13 can have the same arrangement as that in the fourth embodiment. It is also possible to provide a bias layer as in the fifth embodiment. Furthermore, a modification in each embodiment is applicable.

[6-2] Effects

According to the sixth embodiment, it is possible to obtain the same effects as those in the first to fifth embodiments.

In the sixth embodiment, it is possible to form the underlayer 12 containing oxygen, nitrogen, boron, or carbon by performing one of oxidation, nitriding, boriding, and carbonization prior to deposition of the underlayer 12. This can decrease the interfacial energy in depositing an AlTiN layer as the underlayer 12, thereby improving the flatness of the underlayer 12. Furthermore, it is possible to improve the flatness of the lower electrode 11 by etching the surface of the TaO layer. As a result, it is possible to improve the flatness of the recording layer 13 and an intermediate layer 14. This can further improve the MR ratio.

As described above, according to the magnetoresistive element in the above-described embodiment, the underlayer 12 of the MTJ element 10 has an arrangement so as to decrease the damping constant. With this arrangement, it is possible to attempt to decrease a write current.

Note that in this specification, "nitride", "boride", "carbide", or "oxide" may contain B, N, O, or C, and need only be "nitrogen-containing substance", "boron-containing substance", "carbon-containing substance", or "oxygen-containing substance".

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
    a first magnetic layer;
    a second magnetic layer;
    a nonmagnetic layer provided between the first magnetic layer and the second magnetic layer; and
    a first underlayer containing B and provided on an opposite side of a surface of the second magnetic layer on which the nonmagnetic layer is provided, wherein the first underlayer comprises an amorphous structure, and is nonmagnetic.

2. The magnetoresistive element according to claim 1, wherein the first underlayer further contains Hf or Ta.

3. The magnetoresistive element according to claim 1, wherein the first underlayer further contains a compound of B and Hf, or a compound of B and Ta.

4. The magnetoresistive element according to claim 1, further comprising a second underlayer provided between the second magnetic layer and the first underlayer.

5. The magnetoresistive element according to claim 4, wherein the second underlayer contains one of Ir, Pd, or Pt.

6. The magnetoresistive element according to claim 4, wherein the second underlayer is thinner than the first underlayer.

7. The magnetoresistive element according to claim 1, wherein the first magnetic layer has magnetic anisotropy perpendicular to a film surface and having an invariable magnetization direction, and the second magnetic layer has magnetic anisotropy perpendicular to a film surface and having a variable magnetization direction.

8. The magnetoresistive element according to claim 1, wherein the nonmagnetic layer contains an insulator.

9. The magnetoresistive element according to claim 8, wherein the insulator contains a MgO.

10. The magnetoresistive element according to claim 1, wherein the nonmagnetic layer is a tunnel barrier layer.

* * * * *